United States Patent
Hopper et al.

(10) Patent No.: US 6,458,677 B1
(45) Date of Patent: Oct. 1, 2002

(54) PROCESS FOR FABRICATING AN ONO STRUCTURE

(75) Inventors: Dawn M. Hopper; David K. Foote, both of San Jose; Bharath Rangarajan, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/433,186

(22) Filed: Oct. 25, 1999

(51) Int. Cl.[7] .................. H01L 21/3205; H01L 21/4763
(52) U.S. Cl. ...................... 438/591; 438/593; 438/594; 438/954
(58) Field of Search ................................ 438/591, 593, 438/594, 763, 788, 792, 787, 791, 954

(56) References Cited

U.S. PATENT DOCUMENTS

| | | | | | |
|---|---|---|---|---|---|
| 5,585,292 A | * | 12/1996 | Morita et al. | ............... | 437/407 |
| 5,619,052 A | * | 4/1997 | Chang et al. | ............... | 257/321 |
| 6,037,223 A | * | 3/2000 | Su et al. | ............... | 438/257 |
| 6,069,069 A | * | 5/2000 | Chooi et al. | ............... | 438/634 |
| 6,074,917 A | * | 6/2000 | Chang et al. | ............... | 438/261 |
| 6,144,062 A | * | 11/2000 | Mine et al. | ............... | 257/317 |

OTHER PUBLICATIONS

Wolf et al. Silicon Processing for the VLSI Era, vol. 2, Lattice Press: Sunset Beach, CA, p. 194, 1990.*

* cited by examiner

*Primary Examiner*—Charles Bowers, Jr.
*Assistant Examiner*—Erik Kielin
(74) *Attorney, Agent, or Firm*—Amin & Turocy, LLP

(57) ABSTRACT

A process for fabricating an ONO floating-gate electrode in a two-bit EEPROM device includes the sequential formation of a first silicon oxide layer, a silicon nitride layer and a second silicon oxide layer using an in-situ deposition process in which the silicon nitride layer is not exposed to ambient atmosphere prior to the formation of the top oxide layer. To avoid exposure to ambient atmosphere, the first silicon oxide layer, the silicon nitride layer and the second silicon oxide layer are sequentially formed using either a PECVD or a SACVD process.

15 Claims, 3 Drawing Sheets

PROCESS FOR FABRICATING AN ONO STRUCTURE

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,239 now U.S. Pat. No. 6,218,222. "A METHOD TO GENERATE A MONOS TYPE FLASH CELL USING POLYCRYSTALLINE SILICON AS AN ONO TOP LAYER",.

U.S. patent application Ser. No. 09/426,255 now U.S. Pat. No. 6,207,502. "METHOD OF USING SOURCE/DRAIN NITRIDE FOR PERIPHERY FIELD OXIDE AND BIT-LINE OXIDE",.

U.S. patent application Ser. No. 09/426,672 now U.S. Pat. No. 6,265,268. "HIGH TEMPERATURE OXIDE DEPOSITION PROCESS FOR FABRICATING AN ONO FLOATING-GATE ELECTRODE IN A TWO-BIT EEPROM DEVICE",.

U.S. patent application Ser. No. 09/426,240 now U.S. Pat. No. 6,180,538. "PROCESS FOR FABRICATING AN ONO FLOATING-GATE ELECTRODE IN A TWO-BIT EEPROM DEVICE USING RAPID-THERMAL-CHEMICAL-VAPOR-DEPOSITION",.

U.S. patent application Ser. No. 09/426,430 now U.S. Pat. No. 6,248,628. "METHOD OF FABRICATING AN ONO DIELECTRIC BY NITRIDATION FOR MNOS MEMORY CELLS",.

U.S. patent application Ser. No. 09/433,041. "PROCESS FOR FABRICATING AN ONO STRUCTURE HAVING A SILICON-RICH SILICON NITRIDE LAYER,".

U.S. patent application Ser. No. 09/433,037. "NITRIDATION PROCESS FOR FABRICATING AN ONO FLOATING-GATE ELECTRODE IN A TWO-BIT EEPROM DEVICE".

FIELD OF THE INVENTION

The present invention relates, in general, to non-volatile memory devices and to methods for their fabrication and, more particularly, to the fabrication of ONO layers in non-volatile memory devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transferred to a floating-gate electrode through a dielectric layer overlying the channel region of the enhancement transistor. The electron transfer is initiated by either hot electron injection or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode, and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride, in combination with silicon dioxide, is known to provide satisfactory dielectric separation between the control-gate electrode and the channel region of the enhancement transistor while possessing electrical characteristics sufficient to store electrical charge.

One important dielectric material for the fabrication of the floating-gate electrode is an oxide-nitride-oxide (ONO) structure. During programming, electrical charge is transferred from the substrate to the silicon nitride layer in the ONO structure. Voltages are applied to the gate and drain creating vertical and lateral electric fields which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid the creation of interface states that could provide charge leakage paths within the ONO layer. Accordingly, advances in ONO fabrication technology are necessary to insure proper charge isolation in ONO structures used in two-bit EEPROM devices.

SUMMARY OF THE INVENTION

The present invention is for a process for fabricating an ONO structure that can be part of a floating-gate electrode in a two-bit EEPROM device or a dielectric layer in a stacked-gate device. Fabrication of a two-bit EEPROM device or a stacked-gate device using an ONO structure requires the formation of a high quality ONO layer. In the case of a two-bit EEPROM device, this is because proper functionality of the two-bit EEPROM device requires localized charge storage within the ONO structure. In particular, the top oxide layer must have a density sufficient to minimize the formation of charge traps. The formation of charge traps in the top oxide layer can lead to undesirable charge leakage within the top oxide layer and at the interface between the top oxide layer and the underlying silicon nitride layer. In a properly formed ONO structure, all electrical charge is stored in the silicon nitride layer. By fabricating a high quality top oxide layer, stored charge in the ONO structure remains localized within predetermined regions in the silicon nitride layer.

As a dielectric layer in a stacked-gate device, the ONO structure must electrically isolate a floating-gate electrode from a control-gate electrode. High quality oxide/nitride interfaces are necessary to effectively isolate the gate electrodes.

In one form, a process for fabricating an ONO floating-gate electrode includes providing a semiconductor substrate and forming a first silicon oxide layer on the semiconductor substrate. Then, a silicon nitride layer is formed to overlie the first silicon oxide layer. A second layer of silicon oxide is then formed to overlie the silicon nitride layer. The first silicon oxide layer, the silicon nitride layer and the second silicon oxide layer are sequentially formed using either a PECVD or a SACVD process.

Figure 1:
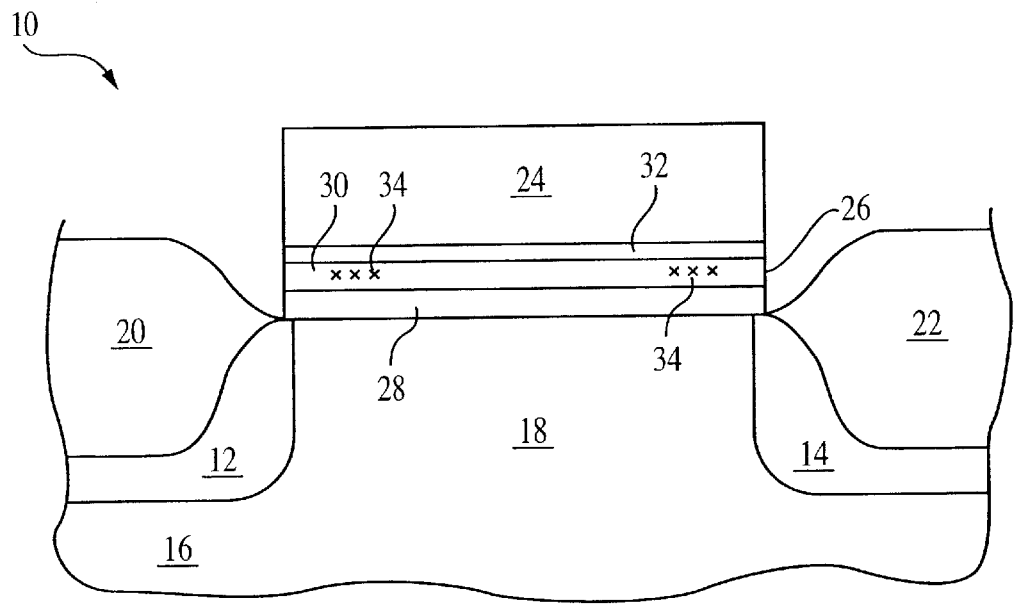
FIG. 1 illustrates, in cross-section, a portion of a semiconductor substrate containing a floating-gate transistor that incorporates an ONO structure fabricated in accordance with the invention.

It should be appreciated that, for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is a floating-gate transistor 10 suitable for use in a two-bit EEPROM device. Floating-gate transistor 10 includes source/drain regions 12 and 14 located in a semiconductor substrate 16 and separated by a channel region 18. First and second bit line oxide regions 20 and 22 overlie source/drain regions 12 and 14, respectively. A control gate electrode 24 overlies channel region 18 and is separated therefrom by an ONO structure 26. Control gate electrode 24 and ONO structure 26 form a stacked-gate structure.

ONO structure 26 includes a first silicon oxide layer 28 overlying channel region 18. A silicon nitride layer 30 overlies first silicon oxide layer 28. A second silicon oxide layer (or top oxide layer) 32 overlies silicon nitride layer 30.

In the operation of floating-gate transistor 10, voltages are applied to control-gate electrode 24 and to source/drain regions 12 and 14 that cause electrical charge from source/drain regions 12 and 14 to propagate across channel region 18. Once the charge encounters a sufficiently strong vertical field, the charge is either injected or tunnels from channel region 18 into silicon nitride layer 30. For example, depending upon the particular voltage levels applied to control-gate electrode 24 and to source/drain regions 12 and 14, electrical charge 34 is transferred into silicon nitride layer 30 and is localized to regions in proximity to either source/drain region 12 or source/drain region 14.

Those skilled in the art will recognize that the proper functioning of a two-bit EEPROM device necessarily requires that electrical charge 34 remain isolated in the regions of silicon nitride layer 30 to which it is initially introduced. The proper maintenance of electrical charge 34 in localized regions of silicon nitride layer 30 is critical to the proper performance of a two-bit EEPROM device. In particular, the quality of ONO structure 26 must be such that charge leakage paths are minimized at the interface between the first and second silicon oxide layers 28 and 32, and silicon nitride layer. Additionally, second silicon oxide layer 32 must be of sufficient density such that charge trapping sites are minimized within the silicon oxide material.

In accordance with the invention, charge leakage within ONO structure 26 is minimized by forming a high quality ONO layer. The reduced charge leakage and improved floating-gate transistor performance obtained by the present invention can be better understood following a description of an ONO fabrication process carried out in accordance with the invention.

Figure 2:
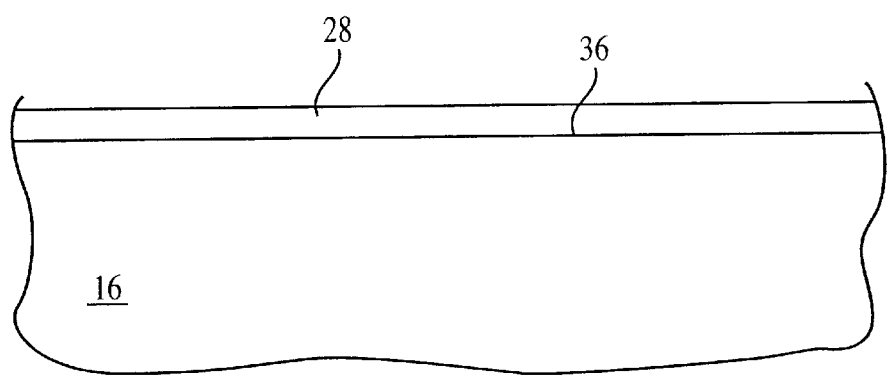
FIGS. 2–4 illustrate, in cross-section, process steps for the fabrication of an ONO structure in accordance with the invention.
Figure 3:
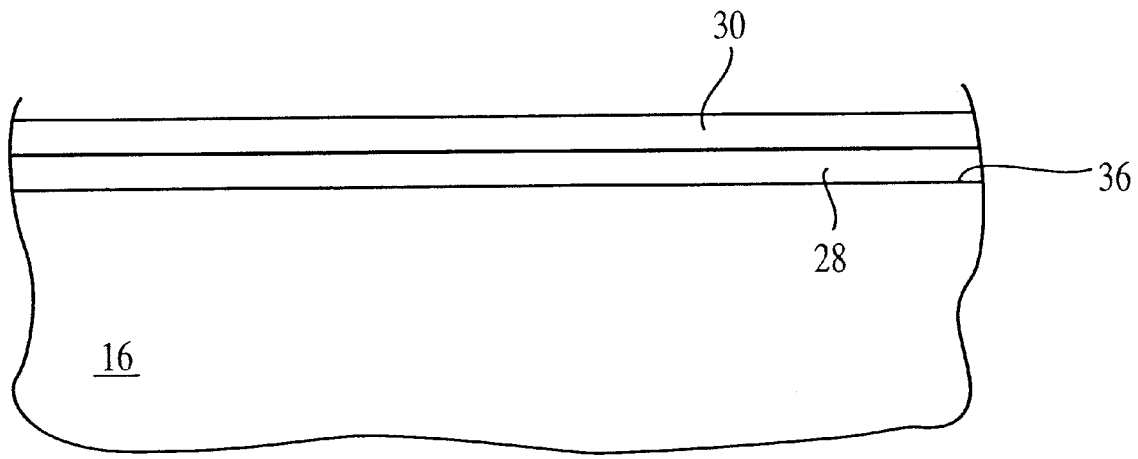
Figure 4:
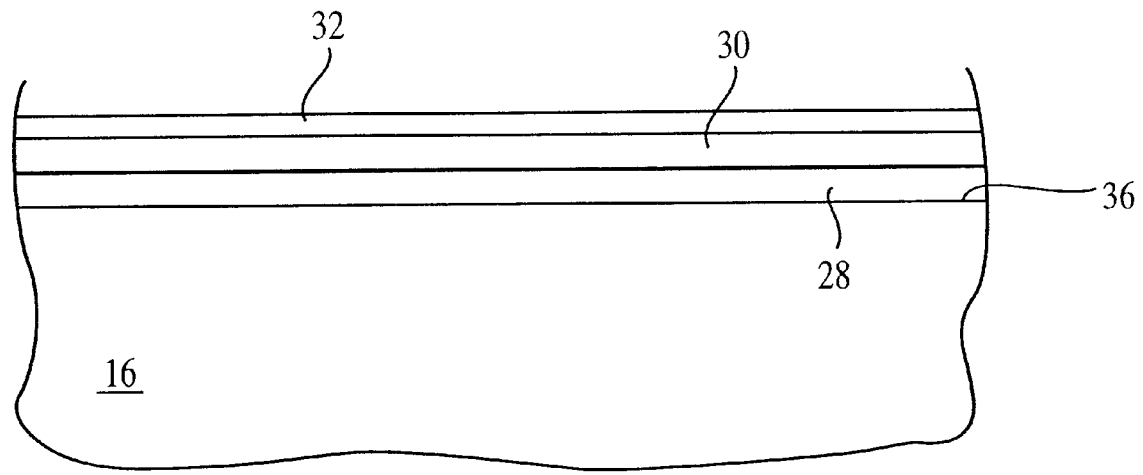

Referring to FIG. 2, first silicon dioxide layer 28 is formed to overlie the surface of semiconductor substrate 16. Preferably, semiconductor substrate 16 is a single crystal silicon substrate. Semiconductor substrate 16 has an upper surface 36 previously processed to remove debris and native oxides. A first silicon oxide layer 28 is formed to overlie upper surface 36. After forming first silicon oxide layer 28, silicon nitride layer 30 is formed to overlie first silicon oxide layer 28, as illustrated in FIG. 3. After forming silicon nitride layer 30, second silicon oxide layer 32 is formed to overlie silicon nitride layer 30, as illustrated in FIG. 4. Preferably, first silicon oxide layer 28, silicon nitride layer 30 and second oxide layer 32 are sequentially formed by either a plasma-enhanced-chemical-vapor-deposition (PECVD) process or a sub-atmospheric CVD (SACVD) process.

Preferably, first silicon oxide layer 28 if formed by PECVD using an RF power of about 100W to about 700W, and more preferably, about 200W, and a temperature of about 300° C. to about 500° C., and more preferably, about 400° C. The silicon oxide layer is preferably formed by reacting silane ($SiH_4$) and nitrous oxide ($N_2O$) in a nitrogen carrier gas. The silicon flow rate is preferably about 10 sccrn to about 500 sccm, and more preferably, about 75 sccm. The nitrous oxide flow rate is preferably about 10 sccm to about 5000 sccm, and more preferably, about 1250 sccm. In an alternative embodiment, the oxide deposition can be carried out using tetraethylorthosilicate (TEOS) and oxygen.

For the formation of silicon nitride, the PECVD process is preferably carried out at an RF power of about 100W to about 700W, and more preferably, about 600W, and temperature of about 300° C. to about 500° C., and more preferably, about 400° C. The silicon nitride material is formed by reacting ammonia ($NH_3$) and silane. The processes is carried out for a period of time and at gas flow rates sufficient to form a silicon nitride layer preferably having a thickness of about 50 to about 150 angstroms, and more preferably about 100 angstroms. In one embodiment of the invention, ammonia is introduced in the PECVD apparatus at a flow rate of about 10 sccm to about 500 sccm and, more preferably, about 130 sccm, and silane is introduced at a flow rate of about 10 sccm to about 500 sccm and, more preferably, about 170 sccm.

In accordance with the invention, second silicon oxide layer 32 is also formed by means of PECVD process. Preferably, second silicon oxide layer 32 is also formed in a PECVD apparatus using nitrous oxide ($N_2O$) and silane. The PECVD processes are preferably carried out using substantially the same conditions described above for formation of first silicon oxide layer 28. The PECVD process forms a silicon oxide layer having a preferred thickness of about 50 to about 150 angstroms and, more preferably, about 100 angstroms. The PECVD process is preferably carried out at an applied RF power setting of about 100W to about 700W and, more preferably, about 600W.

In accordance with another embodiment of the invention, first and second silicon oxide layers 28 and 32 can be formed in a SACVD apparatus using either silane and nitrous oxide or tetraethylorthosilane (TEOS) gases preferably at a temperature of about 200° C. to about 600° C. The operating pressure is preferably about 10 torr to about 760 torr, and more preferably, about 450 torr. Silicon nitride layer 30 can be deposited in the SACVD apparatus using a mixture of ammonia and silane gases at a temperature of about 200° C. to about 600° C. and, more preferably, about 400° C., and a pressure of about 10 torr to about 760 torr and, more preferably, about 400 torr.

The foregoing PECVD and SACVD processes for the formation of ONO structure 26 and the top oxide layer advantageously provide an in-situ process for the sequential formation of individual layers within the ONO structure. In particular, the formation of first silicon oxide layer 28, silicon nitride layer 30 and second silicon oxide layer 32 in a sequential, in-situ deposition sequence minimizes contamination at the silicon nitride/silicon oxide interfaces. Additionally, uncontrolled native oxidation can be reduced to insure that a single, high-density silicon oxide layer is deposited over silicon nitride layer 30. An important aspect of the invention includes the sequential formation of silicon nitride layer 30, and second silicon oxide layer 32 in the absence of exposure of silicon nitride layer 30 to ambient atmosphere. Following the deposition of silicon nitride layer 30 onto first silicon oxide layer 28, substrate 16 is transferred to an oxide deposition chamber under vacuum conditions without exposing the substrate to ambient atmosphere. Alternatively, a positive-pressure inert gas atmosphere can be introduced during wafer transfer.

Those skilled in the art will appreciate that various means exist for insuring that silicon nitride layer 30 is not exposed to ambient atmosphere prior to the deposition of second silicon oxide layer 32. For example, a PECVD or SACVD cluster/tool apparatus can be used in which semiconductor substrate 16 is transferred from a nitride deposition chamber to an oxide deposition chamber in a continuous vacuum environment, or in a positive pressure inert gas atmosphere. Alternatively, the nitride deposition and oxide deposition processes can be sequentially carried out in a single deposition chamber that is configured to receive various processing gases. Accordingly, all such variations and modifications are contemplated in the present invention.

Following the formation of ONO structure 26, the stacked-gate structure shown in FIG. 1 is completed by depositing a layer of gate forming material overlying second silicon oxide layer 32. A lithographic patterning and etching process is then carried out to define control-gate electrode 34 and an ONO floating-gate electrode. Those skilled in the art will recognize that various gate-forming materials can be used to fabricate control-gate electrode 24. For example, control-gate electrode 24 can be formed with polycrystalline silicon, amphorous silicon, a refractory metal silicide and the like.

In another embodiment of the invention, a process for the fabrication of a stacked-gate advantageously incorporates an ONO structure as a dielectric material between a floating-gate electrode and a control-gate electrode. In a stacked-gate structure used in a non-volatile memory device, such as an electrically-erasable-read-only-memory (EEPROM) device, an ONO layer is typically employed to electrically isolate a floating-gate electrode from a control-gate electrode.

Figure 5:
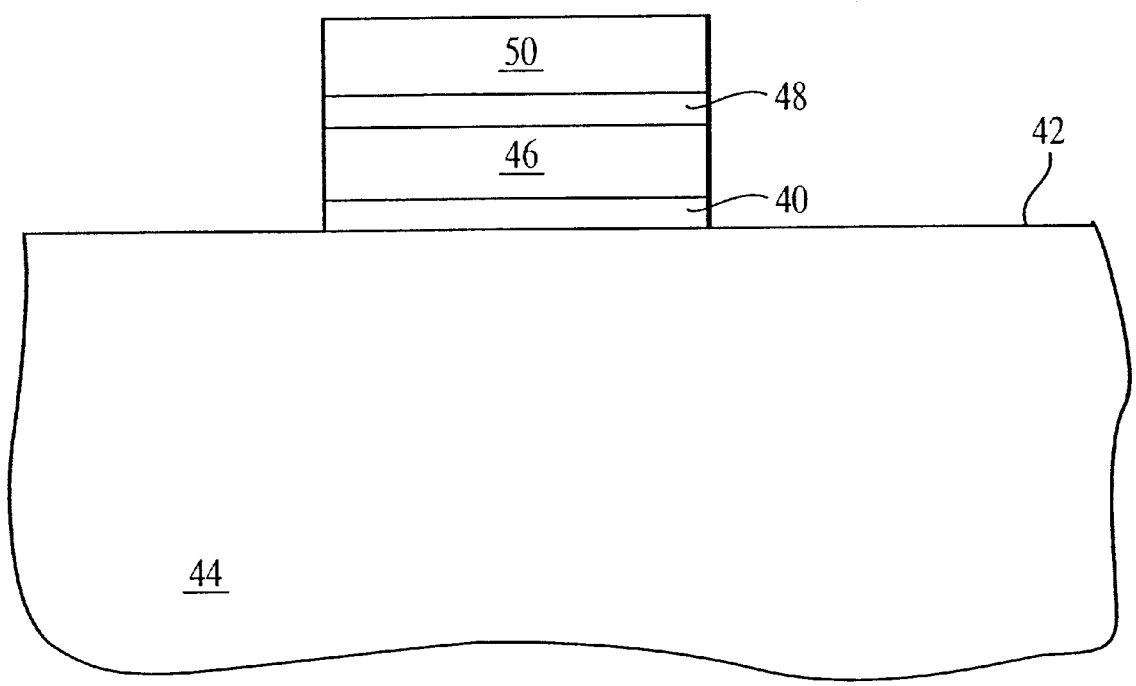
FIG. 5 illustrates, in cross-section, a stacked-gate device fabricated in accordance with the invention.

As illustrated in FIG. 5, a stacked-gate structure is fabricated by initially forming a first dielectric layer 40 overlying a surface 42 of a semiconductor substrate 44. A floating-gate electrode 46 is formed to overlie first dielectric layer 40. Floating-gate electrode 46 can be, for example, polycrystalline silicon doped with an n-type dopant, such as phosphorus or arsenic, to impart electrical conductivity to the polycrystalline silicon. Alternatively, floating-gate electrode 46 can be a refractory metal silicide, and the like. An ONO 48 is formed to overlie floating-gate electrode 46 and a control-gate electrode 50 is formed to overlie ONO layer 48. Preferably, control-gate electrode 50 is fabricated using a material substantially similar to that used to fabricate floating-gate electrode 46.

In accordance with the invention, the individual layers of ONO layer 48 are sequentially formed by a PECVD process. The operating parameters set forth in the previous embodiment described above can be used to form ONO layer 48. It is important to note that the present invention contemplates the sequential deposition of the individual layers of ONO layer 48 within a single PECVD processing apparatus. Those skilled in the art will appreciate that significant production efficiency can be obtained through the formation of the entire ONO layer in a single apparatus without exposure to ambient conditions at intermediate points in the process. In methods of the prior art, separate furnaces and deposition systems are used to form each layer of an ONO structure.

Thus, there has been disclosed, in accordance with the invention, a process for fabricating an ONO structure that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabricating an ONO layer in a non-volatile memory device comprising the steps of:
    providing a semiconductor substrate;
    forming a floating-gate layer overlying the silicon substrate;
    forming a first silicon oxide layer overlying the floating-gate layer;
    forming a silicon nitride layer overlying the first silicon oxide layer;
    forming a second silicon oxide layer overlying the silicon nitride layer,
    wherein the first silicon oxide layer, the silicon nitride layer and the second silicon oxide layer are sequentially formed using a SACVD process in the absence of exposure to ambient atmosphere; and
    forming a control-gate layer overlying the ONO layer formed in the absence of exposure to ambient atmosphere.

2. The process of claim 1, wherein the SACVD process comprises depositing the first and second oxide layers using nitrous oxide and a second gas selected from the group consisting of silane, dichlorosilane and tetraethylorthosilicate.

3. The process of claim 2, wherein the SACVD process is carried out at a pressure of about 10 torr to about 760 torr.

4. The process of claim 1, wherein the SACVD process comprises depositing the silicon nitride layer using ammonia and silane.

5. The process of claim 1, wherein the SACD process comprises sequentially forming the first silicon oxide layer, the silicon nitride layer and the second silicon oxide layer in a SACVD apparatus.

6. A process for fabricating a stacked-gate structure including an ONO floating-gate electrode in a two-bit EEPROM device comprising the steps of:
    providing a semiconductor substrate having a first bit-line oxide layer and a second bit-line oxide layer therein separated by a substrate surface region;
    forming an ONO layer on the substrate surface region,
    wherein the ONO layer includes a first silicon oxide layer, a silicon nitride layer, and a second silicon oxide layer, and
    wherein the first silicon oxide layer, the silicon nitride layer and the second silicon oxide layer are sequentially formed using a process selected from the group consisting of PECVD and SACVD;
    depositing a gate electrode layer overlying the ONO layer; and
    forming a stacked-gate structure on the substrate surface region,
    wherein the stacked-gate structure includes a control-gate electrode overlying an ONO floating-gate electrode.

7. The process of claim 6, wherein the SACVD process comprises depositing the first and second oxide layers using nitrous oxide and a second gas selected from the group consisting of silane, dichlorosilane and tetraethylorthosilicate.

8. The process of claim 7, wherein the SACVD process is carried out at a pressure of about 10 torr to about 760 torr.

9. The process of claim 8, wherein the SACVD process comprises depositing the silicon nitride layer using ammonia and silane.

10. The process of claim 6, wherein the SACVD process comprises sequentially forming the first silicon oxide layer, the silicon nitride layer and the second silicon oxide layer in a SACVD apparatus in the absence of exposure to ambient atmosphere.

11. The process of claim 6, wherein the PECVD process comprises depositing the first and second oxide layers using nitrous oxide and a second gas selected from the group consisting of silane and dichlorosilane.

12. The process of claim 11, wherein the PECVD process comprises depositing the silicon nitride layer using ammonia and silane.

13. The process of claim 6, wherein the PECVD process comprises sequentially forming the first silicon oxide layer, the silicon nitride layer and the second silicon oxide layer in a PECVD apparatus in the absence of exposure to ambient atmosphere.

14. A process for fabricating a stacked-gate in a non-volatile memory device comprising the steps of:
    providing a semiconductor substrate having a silicon surface region;
    forming a first dielectric layer overlying the semiconductor substrate;
    forming a floating-gate layer overlying the first dielectric layer;
    forming an ONO layer overlying the floating-gate layer;
    wherein the ONO layer includes a first silicon oxide layer, a silicon nitride layer and a second silicon oxide layer, and
    wherein the first silicon oxide layer, the silicon nitride layer, and the second silicon oxide layer are sequentially formed using a SACVD process;
    forming a control-gate layer overlying the ONO layer; and
    patterning the control-gate layer, the ONO layer, and the floating-gate layer to form a stacked-gate structure, wherein the SACVD process comprises sequentially forming the first silicon oxide layer, the silicon nitride layer and the second silicon oxide layer in a SACVD apparatus in the absence of exposure to ambient atmosphere.

15. The process of claim 14, wherein the SACVD process is carried out at a pressure of about 10 torr to about 760 torr.

* * * * *